(12) United States Patent
Ahn et al.

(10) Patent No.: US 11,573,587 B2
(45) Date of Patent: Feb. 7, 2023

(54) APPARATUS AND METHOD FOR NON-INVASIVELY ANALYZING BEHAVIORS OF MULTIPLE POWER DEVICES IN CIRCUIT AND MONITORING POWER CONSUMED BY INDIVIDUAL DEVICES

(71) Applicant: Starkoff Co., Ltd., Seoul (KR)

(72) Inventors: Tae Hyo Ahn, Seoul (KR); Hyun Kwon Ahn, Seoul (KR); Han Soo Kim, Seoul (KR)

(73) Assignee: Starkoff Co., Ltd., Seoul (KR)

( * ) Notice: Subject to any disclaimer, the term of this patent is extended or adjusted under 35 U.S.C. 154(b) by 924 days.

(21) Appl. No.: 16/464,937

(22) PCT Filed: Dec. 5, 2017

(86) PCT No.: PCT/KR2017/014142
§ 371 (c)(1),
(2) Date: May 29, 2019

(87) PCT Pub. No.: WO2018/105991
PCT Pub. Date: Jun. 14, 2018

(65) Prior Publication Data
US 2020/0012306 A1 Jan. 9, 2020

(30) Foreign Application Priority Data
Dec. 5, 2016 (KR) .................. 10-2016-0164624

(51) Int. Cl.
*G05F 1/66* (2006.01)
*G01R 21/00* (2006.01)
(Continued)

(52) U.S. Cl.
CPC ............. *G05F 1/66* (2013.01); *G01R 21/005* (2013.01); *G01R 21/133* (2013.01); *H02J 3/12* (2013.01); *H02J 3/003* (2020.01)

(58) Field of Classification Search
CPC ....... G05F 1/66; G01R 21/005; G01R 21/133; G01R 22/10; G01R 19/0092; H02J 3/12;
(Continued)

(56) References Cited

U.S. PATENT DOCUMENTS

| | | | | |
|---|---|---|---|---|
| 4,858,141 A | * | 8/1989 | Hart | .................. G01R 21/1331 340/657 |
| 5,483,153 A | * | 1/1996 | Leeb | .................. G01R 21/1331 340/657 |

(Continued)

FOREIGN PATENT DOCUMENTS

| | | |
|---|---|---|
| JP | 2012-516133 A | 7/2012 |
| JP | 2014-221005 A | 11/2014 |

(Continued)

OTHER PUBLICATIONS

Cole et al., Data extraction for effective non-intrusive identification of residential power loads, May 18, 1998, Instrumentation and Measurement Technology Conference, pp. 812-815, vol. 2.

(Continued)

*Primary Examiner* — Mohammad Ali
*Assistant Examiner* — Dhruvkumar Patel
(74) *Attorney, Agent, or Firm* — Kaplan Breyer Schwarz, LLP

(57) ABSTRACT

A method and apparatus for analyzing power devices in a circuit are disclosed. In one embodiment, a power analysis apparatus analyzes information on power supplied to the circuit and classifies the power patterns into groups of their own similar power patterns by making reference to the information on the power patterns, so as to acquire at least one piece of motif information which is information on at least one fingerprint. The apparatus further counts the frequency of occurrence of each motif and determines a pair of specific motifs having the difference between the counted (Continued)

frequencies of occurrence, which is within a predetermined value range, and average power variation values symmetrical to each other, whereby an accurate determination can be made as to the individual power devices in the circuit.

24 Claims, 4 Drawing Sheets

(51) Int. Cl.
*G01R 21/133* (2006.01)
*H02J 3/12* (2006.01)
*H02J 3/00* (2006.01)

(58) Field of Classification Search
CPC ........ H02J 3/003; H02J 3/00; H02J 13/00002; Y02E 60/00; Y02P 90/82; Y04S 10/30; Y04S 50/14; G06Q 10/04; G06Q 10/06; G06Q 30/0202; G06Q 50/06; G06Q 20/14
See application file for complete search history.

(56) References Cited

U.S. PATENT DOCUMENTS

| | | | |
|---|---|---|---|
| 8,275,561 B2 * | 9/2012 | Alles | H02J 3/00 702/66 |
| 8,554,501 B2 | 10/2013 | Diop et al. | |
| 8,983,670 B2 * | 3/2015 | Shetty | G01D 4/002 706/54 |
| 9,118,182 B2 | 8/2015 | McDonald et al. | |
| 9,465,376 B2 * | 10/2016 | Arya | G05B 15/02 |
| 9,733,286 B2 * | 8/2017 | Chen | G06Q 50/06 |
| 2009/0195349 A1 * | 8/2009 | Frader-Thompson | G01D 4/002 340/3.1 |
| 2013/0159756 A1 | 6/2013 | Ellis | |
| 2014/0336831 A1 * | 11/2014 | Seo | G01D 4/00 700/286 |
| 2015/0316592 A1 | 11/2015 | Minezawa et al. | |

FOREIGN PATENT DOCUMENTS

| | | |
|---|---|---|
| JP | 2015-029402 A | 2/2015 |
| KR | 2014-0132523 A | 11/2014 |
| KR | 2016-0010793 A | 1/2016 |

OTHER PUBLICATIONS

Extended European Search Report issued in EP Patent Application No. 17877915.3 dated Mar. 20, 2020.
International Search Report issued in PCT application No. PCT/KR2017/014142, dated Mar. 21, 2018, 6 pp.

* cited by examiner

FIG. 2
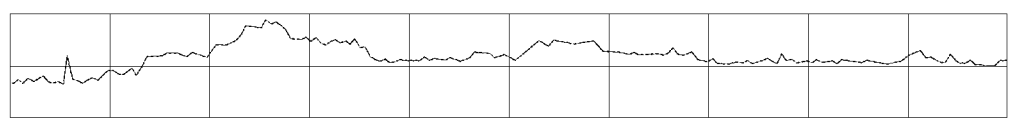
(a)
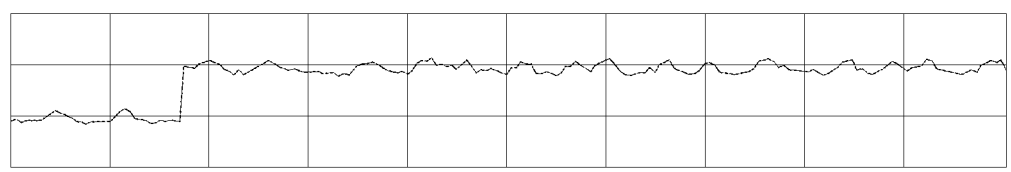
(b)
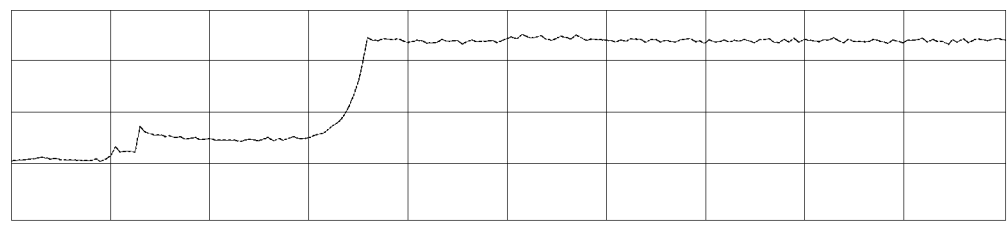
(c)
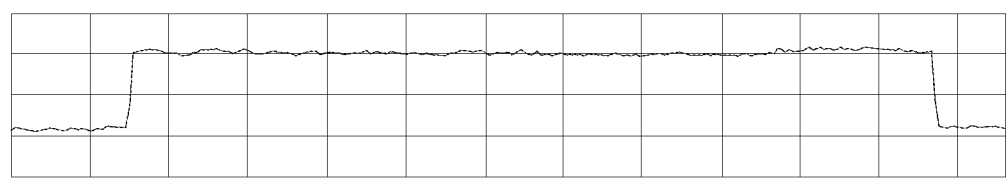
(d)

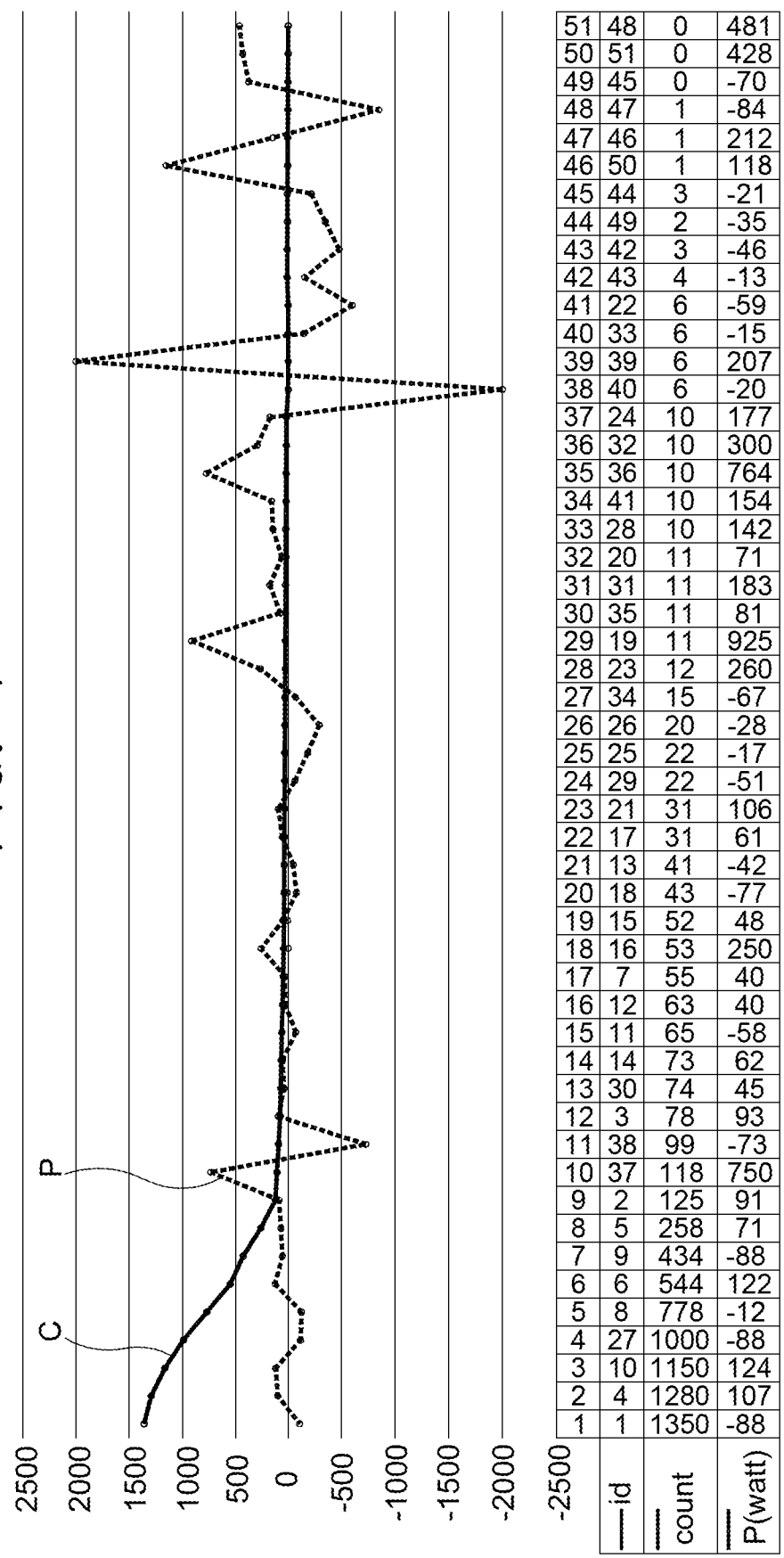

APPARATUS AND METHOD FOR NON-INVASIVELY ANALYZING BEHAVIORS OF MULTIPLE POWER DEVICES IN CIRCUIT AND MONITORING POWER CONSUMED BY INDIVIDUAL DEVICES

FIELD OF THE DISCLOSURE

The present disclosure relates to a method for non-invasively analyzing power devices in a circuit; and more particularly, to the method for analyzing power information on power fed into the circuit, to thereby acquire power pattern information generated according to ON or OFF states of individual power devices, classifying the acquired power pattern information into each group of its own similar power patterns, to thereby acquire at least one piece of motif information on at least one fingerprint, and analyzing the power information on during a preset state-detecting time range, to thereby count the number of occurrences per motif, and determine pairs of specific motifs, whose differences in the number of occurrences per motif are within a preset range and whose average power variations are symmetrical, as information on an operation state of a specific power device among the individual power devices, and the power analyzing device using the same.

BACKGROUND OF THE DISCLOSURE

In order to efficiently manage energy resource, a concept of Smart Grid has been introduced. The Smart Grid refers to an 'intelligent power grid' that optimizes energy efficiency (i) by integrating information technology with an existing unidirectional power grid technology having steps of power generation, transmission/distribution, and sales and (ii) by allowing electricity providers and consumers to exchange information in real-time in both directions. In other words, its basic concept represents that an entire power system works efficiently as a single entity by connecting power plants, transmission and distribution facilities and the consumers with information communication network and by sharing information in both directions.

And, the Smart Grid is actively adopting ICT (Information & Communication Technology) into a power infrastructure in order to more efficiently and effectively manage and control an entire process from power generation to consumption by adding intelligence capabilities to the power infrastructure, and in particular, the Smart Grid is attracting attention as a next-generation power grid that optimizes the energy efficiency (i) by facilitating exchange of real-time power information between the providers and the consumers in both directions through combining communication technology with the power grid and thus (ii) by encouraging reasonable energy consumption through bidirectional power information exchange and providing high-quality energy and various additional services.

In order to provide home energy management service using the Smart Grid as such, it is necessary to provide smart tags for measuring the power consumption of a specific power device installed in a home. Such a smart tag is installed in an outlet so as to measure the power consumption of a power device connected to the outlet and transmit the measured power consumption to a smart meter.

However, in general, one or more power devices and outlets are used in the home, and a smart tag must be provided for each power device or each outlet. If the smart tag is to be provided for each outlet in the home or each power device, the cost of manufacturing and installation of the smart tag will increase and, as a result, the cost of establishment of the smart grid will increase considerably.

In order to solve such a problem, a Non-Intrusive Appliance Load Monitoring (NIALM) technique as disclosed in Korean Patent Laid-Open Publication No. 10-2016-0010793, U.S. Pat. Nos. 8,554,501, and 9,118,182 has been proposed, which is a technique that identifies whether individual power devices in the home are in use and how much an amount of the power consumption is by analyzing total power information (voltage and current).

And, such conventional non-invasive monitoring of load on home appliances analyzes whether the individual power devices are in use and how much the amount of the power consumption is by using a change in the amount of the power consumption, an overload analysis, or similar load patterns in the home.

However, since a step response caused by ON/OFF operation of power devices is different from that of an ideal power device, depending on an AC power characteristic, an initial state characteristic of the power devices, etc., therefore, the conventional non-invasive monitoring of load on home appliances has a difficulty in identifying the individual power devices.

SUMMARY OF THE DISCLOSURE

It is an object of the present invention to solve all the aforementioned problems.

It is another object of the present disclosure to identify individual power devices in a circuit by using a non-invasive method.

It is still another object of the present disclosure to allow settlement of cost of consumed electricity according to characteristic of the individual power devices since the individual power devices in the circuit are identified.

It is still yet another object of the present disclosure to partly select real-time power consumption data in the circuit efficiently and store or transmit the partly selected real-time power consumption data.

In order to accomplish objects above and characteristic effects to be described later of the present disclosure, distinctive structures of the present disclosure are described as follows.

In accordance with one aspect of the present disclosure, there is provided a method for non-invasively analyzing power devices in a circuit, including steps of: (a) a power analyzing device analyzing power information on power fed into the circuit, to thereby acquire power pattern information generated according to ON or OFF states of individual power devices; (b) the power analyzing device classifying pieces of the acquired power pattern information into each group of its own similar power patterns, to thereby acquire at least one piece of motif information which is information on at least one fingerprint; and (c) the power analyzing device analyzing the power information on power fed into the circuit during a preset state-detecting time range, to thereby count the number of occurrences per motif, and determine one or more pairs of specific motifs, whose differences in the number of occurrences per motif are within a preset range and whose average power variations are symmetrical to each other, as information on an operation state of a specific power device among the individual power devices.

In accordance with another aspect of the present disclosure, there is provided a power analyzing device for non-invasively analyzing power devices in a circuit, including: a communication part for acquiring power information on power fed into the circuit; and a processor for performing processes of (I) analyzing the power information, to thereby acquire power pattern information generated according to ON or OFF states of individual power devices, (II) classifying pieces of the acquired power pattern information into each group of its own similar power patterns, to thereby acquire at least one piece of motif information which is information on at least one fingerprint, and (III) analyzing the power information on power fed into the circuit during a preset state-detecting time range, to thereby count the number of occurrences per motif, and determine one or more pairs of specific motifs, whose differences in the number of occurrences per motif are within a preset range and whose average power variations are symmetrical to each other, as information on an operation state of a specific power device among the individual power devices.

In addition, recordable media that are readable by a computer for storing a computer program to execute the method of the present disclosure is further provided.

BRIEF DESCRIPTION OF THE DRAWINGS

FIG. 2 is a drawing schematically illustrating power patterns generated according to ON/OFF states of individual power devices when analyzing the power devices in the circuit by using the non-invasive method in accordance with one example embodiment of the present disclosure.

FIG. 4 is a drawing schematically illustrating a motif-counting graph for explaining a method of identifying the individual power devices according to ON/OFF operation when analyzing the power devices in the circuit by using the non-invasive method in accordance with one example embodiment of the present disclosure.

DETAILED DESCRIPTION OF THE PREFERRED EMBODIMENTS

Figure 1:
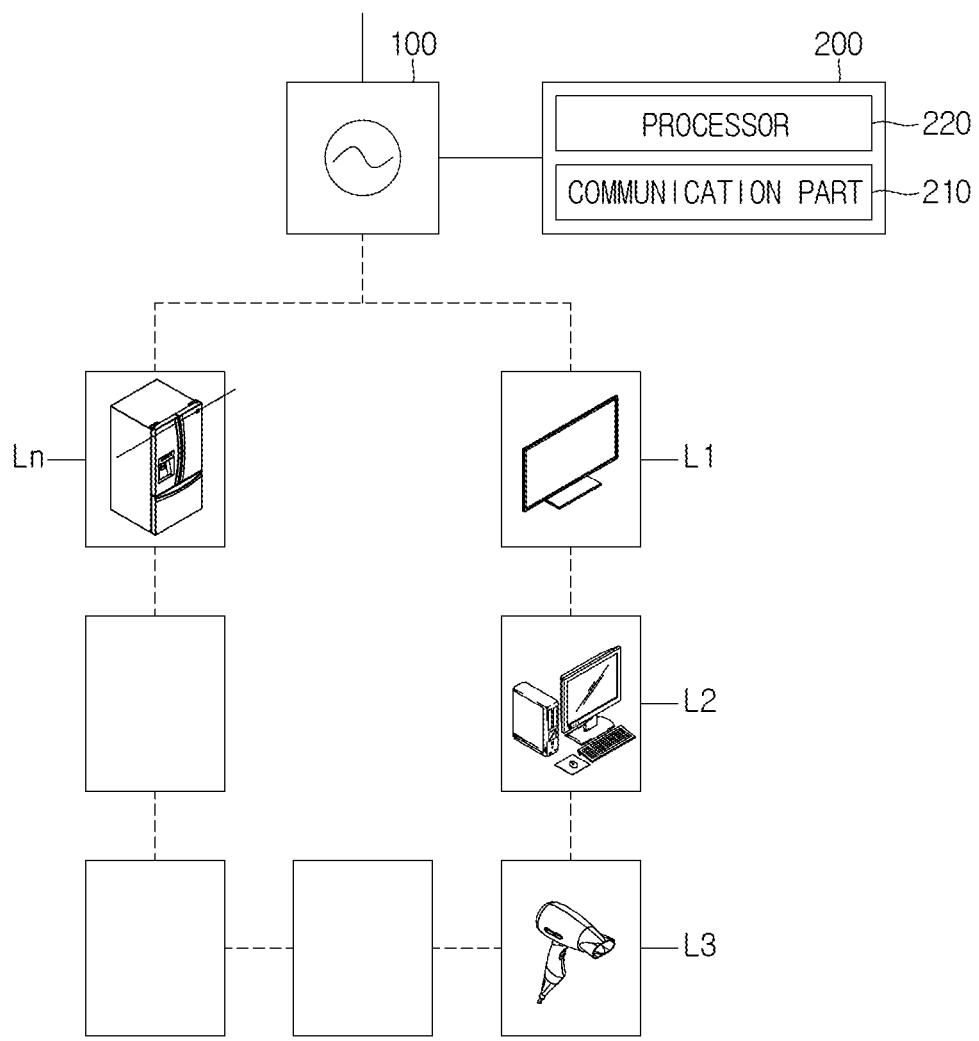
FIG. 1 is a drawing schematically illustrating a power analyzing device which analyzes power devices in a circuit by using a non-invasive method in accordance with one example embodiment of the present disclosure.

In the following detailed description, reference is made to the accompanying drawings that show, by way of illustration, specific embodiments in which the disclosure may be practiced. These embodiments are described in sufficient detail to enable those skilled in the art to practice the disclosure. It should be noted that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it should be noted that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

To allow those skilled in the art to the present disclosure to be carried out easily, the example embodiments of the present disclosure by referring to attached diagrams will be explained in detail as shown below.

FIG. 1 is a drawing schematically illustrating a power analyzing device which analyzes power devices in a circuit by using a non-invasive method in accordance with one example embodiment of the present disclosure. By referring to FIG. 1, the power analyzing device 200 may include a communication part 210 and processor 220.

First, the communication part 210 may acquire power information on power fed into the circuit from a power information detecting part 100.

Herein, the circuit is formed by a single main power line with an electricity meter combined, and the power devices may be combined with the main power line, or with a branch power line branching off from the main power line. As one example, the circuit may be an electrical circuit in a home formed by a panel board where a lead-in power line into the home is combined with. And, the power information detecting part 100 may be combined with the electricity meter or the main power line at a front terminal of the electricity meter.

Also, multiple power devices L1, L2, L3, . . . , and Ln may be combined with the circuit. Herein, the power devices may include home appliances, but the scope of the present disclosure is not limited thereto, and may include industrial power devices.

And, the processor 220 (i) may analyze the power information acquired by the communication part 210, to thereby obtain power pattern information generated according to ON or OFF states of the individual power devices L1, L2, L3, . . . , and Ln, and by referring to the acquired power pattern information, (ii) may classify pieces of the obtained power pattern information into each group of its own similar power patterns, to thereby acquire at least one piece of motif information, i.e., OFF-motif or ON-motif information, which is information on one or more fingerprints, (iii) may analyze the power information on power fed into the circuit during a preset state-detecting time range, to thereby count the number of occurrences per motif, and (iv) may pair specific motifs, whose differences in the number of occurrences per motif are within a preset range and whose average power variations are symmetrical to each other. Herein, there may be multiple pairs of the specific motifs, whose differences in the number of occurrences per motif are within the preset range and whose average power variations are symmetrical to each other. As such, each of the multiple pairs may correspond to each of the power devices, and as a result, information ON operation states of each of the power devices may be determined. Herein, an ON-motif may be a step response pattern when the power device is switched on, and an OFF-motif may be a step response pattern when the power device is switched off.

Also, the processor 220 may acquire the motif information and its corresponding average power information as partly selected real-time power consumption data, where the motif information includes a time of occurrence of the motif, and may record or support another device to record the partly selected real-time power consumption data, in order to record activity pattern (i.e., footprint) states of the individual power devices included in the circuit. Herein, the average power information may include at least one of (i) an average power value, (ii) a standard deviation of the average power value, (iii) an average power factor, (iv) a standard deviation of the average power factor, and (v) a sampling cycle for detecting the power information.

With the power analyzing device which analyzes the power devices in the circuit using the non-invasive method configured as such in accordance with one example embodiment of the present disclosure, a method for analyzing the power devices in the circuit is disclosed by referring to FIGS. 1 to 4, as follows.

On condition that the multiple power devices L1, L2, L3, . . . , and Ln have been combined with the circuit, the power analyzing device 200 may acquire the power information on power fed into the circuit, detected by the power information detecting part 100, in real-time via the communication part 210.

And, the power analyzing device 200 may analyze the power information on power fed into the circuit, to thereby acquire the power pattern information generated according to the ON or OFF states of the individual power devices L1, L2, L3, . . . , and Ln.

That is, the power analyzing device 200 may analyze the power information, and if the average power variation of the power consumption measured during a preset sampling-time range is equal to or larger than a preset value, may determine that an event corresponding to one of the ON or OFF states of the individual power devices L1, L2, L3, . . . , and Ln has occurred. As one example, a standard deviation of the power consumption measured during the preset sampling-time range may be calculated, and a point of time when at least one of the average power variations departs from the standard deviation may be determined as a point of time of occurrence of the event. As another example, a variance of the power consumption measured during the preset sampling-time range may be calculated, and a point of time when the calculated variance departs from a boundary value may be determined as the point of time of occurrence of the event.

Herein, supposing that f is a frequency of the power fed into the circuit, the power analyzing device 200 may measure the power consumption per (1/f)×M seconds. Herein, M is a constant larger than zero. As one example, supposing that the frequency of the power fed into the circuit is 60 Hz, the power analyzing device 200 may measure the power consumption per multiple of 1/60 seconds, that is, may measure the power consumption 60 times per second.

And, the power consumption may be measured in real-time corresponding to a window size, i.e., the preset sampling-time range, for measuring real-time power consumption. Herein, the preset sampling-time range may be set as, for example, 10 seconds. However, the preset sampling-time range is not limited thereto, and may be set as any arbitrary range of time.

For reference, the acquired power pattern information may be represented as in FIG. 2, and (a) of FIG. 2 may be an example of a power pattern corresponding to an ON operation of a television, (b) of FIG. 2 may be an example of a power pattern corresponding to an ON operation of a fluorescent lamp, (c) of FIG. 2 may be an example of a power pattern corresponding to an ON operation of a microwave oven, and (d) of FIG. 2 may be an example of a power pattern corresponding to an ON operation of a coffee percolator. As can be seen in FIG. 2, the individual power devices L1, L2, L3, . . . , and Ln may respectively have unique power patterns corresponding to the ON or OFF operations.

Next, the power analyzing device 200 may classify pieces of the acquired power pattern information into each group of its own similar power patterns, to thereby acquire at least one piece of the motif information which is information on at least one fingerprint.

That is, the power analyzing device 200 may classify and group patterns of the power consumption, during preset pattern-acquiring time ranges before and after the occurrence of the event as in FIG. 2 which corresponds to the ON or OFF states of the individual power devices L1, L2, L3, . . . , and Ln, into one or more pairs of specific motifs and store or support another device to store the pairs of specific motifs. As one example, one or more power pattern profiles during a preset time range including points of time when the individual power devices L1, L2, L3, . . . , and Ln are turned ON or OFF may be obtained by referring to the acquired power pattern information, and if power consumptions per time are compared among the acquired power pattern profiles and thus the power pattern profiles are classified into a plurality of groups such that the power consumptions per time corresponding to each of the groups are within a preset range, each of the groups may be determined as having each of its own similar power patterns.

Figure 3:
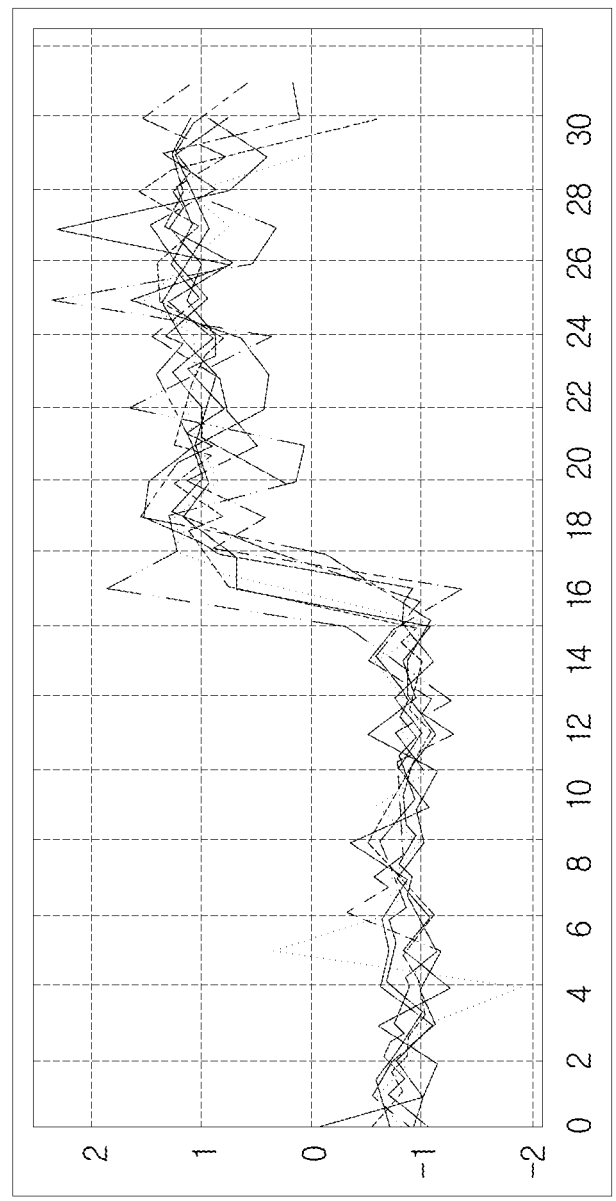
FIG. 3 is a drawing schematically illustrating motifs corresponding to the ON/OFF states of the individual power devices when analyzing the power devices in the circuit by using the non-invasive method in accordance with one example embodiment of the present disclosure.

Herein, each of the motifs may be each of specific patterns corresponding to each of the individual power devices as in FIG. 3. That is, patterns of changes in an initial power value caused by the ON operation, a slope value in an increasing interval of the power value, and patterns of changes in the power value after the ON operation are different for each of the individual power devices, thus the individual power devices can be identified.

And, when classifying and grouping the patterns of the power consumption, the power analyzing device may determine similar patterns of the power consumption with different power factors as different, and may store or support another device to store the similar patterns of the power consumption with the different power factors as different fingerprints.

Herein, the preset pattern-acquiring time range may be a time range including the point of time when the event occurred, and as one example, the preset pattern-acquiring time range may be from one second before the point of time when the event occurred to ten seconds after the point of time when the event occurred. That is, the power analyzing device may store or support another device to store the power consumption pattern, measured from one second before the point of time when the event occurred to ten seconds after the point of time when the event occurred, as the fingerprint. Herein, each of IDs may be allocated to each motif.

And, the power analyzing device 200 may analyze the power information on power fed into the circuit during the preset state-detecting time range, to thereby count the number of occurrences per motif ID, and determine one or more pairs of specific motifs, whose differences in the number of occurrences per motif are within a preset range and whose average power variations are symmetrical to each other, as information on an operation state of a specific power device among the individual power devices. Herein, the term "symmetrical" may represent a change in power amounting to A on one side and a change in power amounting to −A on the other side, and even in case that the two changes are not equal and opposite like A and −A, if their absolute values are similar to each other within a certain range, then the two changes may be determined as symmetrical.

That is, as in FIG. 4, the power analyzing device 200 may count the number C of occurrences per each motif ID by referring to the power information on power fed into the circuit, detected in real-time during the preset state-detecting time range like a week, a month, three months, etc.

In FIG. 4, each ID may be an identification number allocated to each motif, and P may be average power variations at each motif. And, FIG. 4 shows the motifs sorted in descending order of the number C of occurrences.

As one example, in FIG. 4, comparing a motif corresponding to a 38th most counted ID 40 and a motif corresponding to a 39th most counted ID 39, it is seen that the motif corresponding to the ID 40 is identical to the motif corresponding to the ID 39 in the number of occurrences, i.e., 6, and the average power variations are 2,000 and −2,000, i.e., symmetrical. Therefore, by referring to the motif corresponding to the ID 39 and the motif corresponding to the ID 40, the specific power device may be determined as performing the ON or OFF operations six times during the preset state-detecting time range.

And, the power analyzing device 200 may count the pairs of the OFF-motif and ON-motif, to thereby determine the exact number of the individual power devices in the circuit.

However, if two arbitrary motifs, whose differences in the number of occurrences per motif are within the preset range and whose average power variations are symmetrical to each other, are different in their power factors, the power analyzing device 200 may determine that the two arbitrary motifs do not constitute a pair, in which case the two arbitrary motifs may be determined as not being the pair that represents the ON or OFF states of the specific power device. That is, even in case that the numbers of occurrences are similar and that the average power variations are symmetrical, if the difference in the power factors exceeds a certain threshold, then each of the motifs may be determined as caused by operation of different power devices, not by operation of a same power device.

Also, the power analyzing device 200 may acquire the motif information and its corresponding average power information as the partly selected real-time power consumption data where the motif information includes a time information of occurrence of the motif, and may record or support another device to record the partly selected real-time power consumption data, in order to record activity states of the individual power devices included in the circuit. Herein, the average power information may include at least one of (i) the average power value measured during an interval between two points of time of occurrences of two motifs, (ii) the standard deviation of the average power value, (iii) the average power factor, (iv) the standard deviation of the average power factor, and (v) the sampling cycle for detecting the power information.

That is, in order to record the activity states of the individual power devices included in the circuit, according to a conventional art, every piece of information on the power consumption measured in real-time per a preset unit of time was recorded, and as a result, the amount of recorded data became huge, which was a problem. Therefore, to resolve this problem, the power analyzing device 200 may acquire data including the motif information and its corresponding average power information only at the point of time when the motif occurs, i.e., at the point of time when the event occurs caused by the ON or OFF operations of the power device, and may store the partly selected data. This is because power consumption data according to the activity states of the individual power devices may be restored by only using both the power information at the time of occurrence of the motif and the average power information during intervals between points of time of occurrences of the motifs.

As one example, if a first motif occurs at a first point of time and if a second motif occurs at a second point of time, then the power pattern between the first point of time and the second point of time may be determined by referring to (i) a power pattern caused by the first motif at the first point of time, (ii) the average power information, e.g., a power pattern, between the first point of time and the second point of time, including at least one of the average power value, the standard deviation of the average power value, the average power factor, the standard deviation of the average power factor, and (iii) the power pattern caused by the second motif at the second point of time. In addition to this, information like the power consumption of the individual power devices, a total power consumption in the circuit, etc. may be determined.

Also, when settling the cost of the power consumption in the circuit, the power analyzing device 200 may allow settlement of the cost of the total power consumption by applying different criteria for calculating the cost according to characteristics or usage of the individual power devices.

As one example, bills for using cooling devices like an air conditioner in extreme summer or for using heating devices like a heater in extreme winter may be calculated using separate criteria.

The present disclosure has an effect of exact identification of the individual power devices in the circuit by identifying multiple pairs of motifs corresponding to the ON or OFF states of the individual power devices using the number of occurrences per motif and power variations acquired by the non-invasive methods.

The present disclosure has another effect of allowing the settlement of the cost of the power consumption corresponding to the characteristics of the individual power devices, that is, allowing the settlement of the cost of the total power consumption by applying the different criteria for calculating the cost according to the usage of the individual power devices, since information on the individual power devices in the circuit can be determined.

The present disclosure has still another effect of determining information on the total power consumption in the circuit during an entire interval as a subject to be analyzed by using the average power information between points of time when the motifs are acquired and the motif information at the points of time when the motifs are acquired, and as a result, unlike conventional means of storing every piece of information measured in real-time, reducing storage space compared to the conventional means by acquiring the motif information at the point of time when each motif occurs and its corresponding average power information between the points of time when each of the motifs occurs as the partly selected real-time power consumption data and storing the real-time power consumption data, and reducing time for analysis owing to the real-time power consumption data, since the real-time power consumption data as a subject to be analyzed is small.

The embodiments of the present disclosure as explained above may be implemented in a form of executable program command through a variety of computer means recordable to computer readable media. The computer readable media may include solely or in combination, program commands, data files, and data structures. The program commands recorded in the media may be components specially designed for the present disclosure or may be usable to those skilled in the art of computer software. Computer readable media may include magnetic media such as hard disks, floppy disks, and magnetic tapes, optical media such as CD-ROMs and DVDs, magneto-optical media such as floptical disks and hardware devices such as ROM, RAM, and flash memory specially designed to store and carry out program commands. Program commands may include not only a machine language code made by a complier but also a high level code that can be used by an interpreter etc., which may be executed by a computer. The aforementioned hardware device may be configured as one or more software modules to perform the processes of the present disclosure and vice versa.

As seen above, the present disclosure has been explained by specific matters such as detailed components, limited embodiments, and drawings. They have been provided only to help more general understanding of the present disclosure. However, it will be understood by those skilled in the art that various changes and modification may be made from the description without departing from the spirit and scope of the disclosure as defined in the following claims.

Accordingly, the spirit of the present disclosure must not be confined to the explained embodiments, and the following patent claims as well as everything including variations equal or equivalent to the patent claims pertain to the category of the spirit of the present disclosure.

What is claimed is:

1. A method for non-invasively identifying a specific power device among a plurality of power devices in a circuit, the method comprising:
   (a) a power analyzing device analyzing power information on power fed into the circuit, to thereby acquire power pattern information generated according to ON or OFF states of individual power devices;
   (b) the power analyzing device classifying pieces of the acquired power pattern information into each group of its own similar power patterns, to thereby acquire at least one piece of motif information which is information on at least one fingerprint;
   (c) the power analyzing device analyzing the power information on power fed into the circuit during a preset state-detecting time range, to thereby count the number of occurrences per motif, and identify one or more pairs of motifs whose differences in the number of occurrences per motif are within a preset range and whose average power variations are symmetrical to each other; and
   (d) the power analyzing device identifying the specific power device using the one or more pairs of identified motifs as information on an operation state of the specific power device;
   wherein, at the step of (c), in response to counting the number of occurrence per motif, the power analyzing device (i) generates a motif-counting graph by sorting the number of occurrence for each motif in a descending order and plotting the average power variations of each motif against the number of occurrence per motif and thus (ii) acquires one or more pairs of the motifs, whose differences in the number of occurrences per motif are within the preset range and whose average power variations are symmetrical to each other, by referring to the motif-counting graph,
   wherein, the power analyzing device acquires (i) motif information at points of time when each motif occurs and (ii) average power information between the points of time when each motif occurs, as partly selected real-time power consumption data, to thereby record or support another device to record the real-time power consumption data, in order to record activity states of the individual power devices in the circuit, and
   wherein, the power analyzing device acquires a power pattern between a first point of time, corresponding to when a first motif occurs, and a second point of time, corresponding to when a second motif occurs, by referring to (i) a power pattern generated by the first motif at the first point of time, (ii) the average power information between the first point of time and the second point of time, and (iii) a power pattern generated by the second motif at the second point of time.

2. The method of claim 1,
   wherein the average power information includes at least one of (i) an average power value, (ii) a standard deviation of the average power value, (iii) an average power factor, (iv) a standard deviation of the average power factor, or (v) a sampling cycle for detecting the power information.

3. The method of claim 1, wherein, at the step of (a), the power analyzing device analyzes the power information, and if the average power variations of power consumption measured during a preset sampling-time range is equal to or larger than a preset value, determines that an event corresponding to one of the ON or OFF states of the individual power devices has occurred, and
   wherein, at the step of (b), the power analyzing device classifies and groups patterns of the power consumption during a preset pattern-acquiring time range before and after the occurrence of the event, to thereby register its result as the fingerprint.

4. The method of claim 3, wherein, the power analyzing device calculates a standard deviation of the power consumption measured during the preset sampling-time range, and determines a point of time, when at least one of the average power variations departs from the standard deviation, as a time of the occurrence of the event.

5. The method of claim 3, wherein the power analyzing device registers similar patterns of the power consumption, which have different power factors, as different fingerprints, when classifying and grouping the patterns of the power consumption.

6. The method of claim 3, wherein the power analyzing device measures the power consumption per multiple of l/f seconds, and wherein f is a frequency of the power fed into the circuit.

7. The method of claim 3, wherein the preset pattern-acquiring time range is from one second before the occurrence of the event to ten seconds after the occurrence of the event.

8. The method of claim 1, wherein, at the step of (b), the power analyzing device determines the number of the individual power devices in the circuit by counting the number of the pairs of the specific motifs.

9. The method of claim 1, wherein, at the step of (b), the power analyzing device, if power factors of the pairs of the specific motifs, whose differences in the number of occurrences per motif are within the preset range and whose average power variations are symmetrical to each other, are different from each other, determines the pairs of the specific motifs do not correspond to the operation state of the specific power device.

10. The method of claim 1, wherein, at the step of (b), the power analyzing device acquires one or more power pattern profiles during a preset time range including points of time when the individual power devices are turned ON or OFF by referring to the acquired power pattern information, and if power consumptions per time are compared among the acquired power pattern profiles and if the power pattern profiles are classified into a plurality of groups, wherein the power consumptions per time corresponding to each of the groups are within a preset range, determines each of the groups as having each of its own similar power patterns.

11. The method of claim 1, further comprising:
(e) the power analyzing device calculating individual power consumption within the circuit, based on one or more power pattern profiles during a preset time range including points of time when the individual power devices are turned ON or OFF, by referring to the acquired power pattern information.

12. The method of claim 11, wherein, at the step of (e), the power analyzing device calculates the individual power consumption of the specific power device by excluding power consumption of devices, other than the specific power device, from the power pattern profiles during the preset time range including the points of time when the individual power devices are turned ON or OFF by referring to the acquired power pattern information.

13. A power analyzing device for non-invasively identifying a specific power device among a plurality of power devices in a circuit, the power analyzing device comprising:
a communication part for acquiring power information on power fed into the circuit; and
a processor for:
(I) analyzing the power information, to thereby acquire power pattern information generated according to ON or OFF states of individual power devices,
(II) classifying pieces of the acquired power pattern information into each group of its own similar power patterns, to thereby acquire at least one piece of motif information which is information on at least one fingerprint,
(III) analyzing the power information on power fed into the circuit during a preset state-detecting time range, to thereby count the number of occurrences per motif, and identify one or more pairs of motifs whose differences in the number of occurrences per motif are within a preset range and whose average power variations are symmetrical to each other, and
(IV) identifying the specific power device using the one or more pairs of identified motifs as information on an operation state of the specific power device;
wherein, at the process of (III), in response to counting the number of occurrence per motif, the processor (i) generates a motif-counting graph by sorting the number of occurrence for each motif in a descending order and plotting the average power variations of each motif against the number of occurrence per motif and thus (ii) acquires one or more pairs of the motifs, whose differences in the number of occurrences per motif are within the preset range and whose average power variations are symmetrical to each other, by referring to the motif-counting graph,
wherein, the processor acquires (i) motif information at points of time when each motif occurs and (ii) average power information between the points of time when each motif occurs, as partly selected real-time power consumption data, to thereby record or support another device to record the real-time power consumption data, in order to record activity states of the individual power devices in the circuit, and
wherein, the processor acquires a power pattern between a first point of time, corresponding to when a first motif occurs, and a second point of time, corresponding to when a second motif occurs, by referring to (i) a power pattern generated by the first motif at the first point of time, (ii) the average power information between the first point of time and the second point of time, and (iii) a power pattern generated by the second motif at the second point of time.

14. The power analyzing device of claim 13, wherein the average power information includes at least one of (i) an average power value, (ii) a standard deviation of the average power value, (iii) an average power factor, (iv) a standard deviation of the average power factor, and (v) a sampling cycle for detecting the power information.

15. The power analyzing device of claim 13, wherein, at the process of (I), the processor analyzes the power information, and if the average power variations of power consumption measured during a preset sampling-time range is equal to or larger than a preset value, determines that an event corresponding to one of the ON or OFF states of the individual power devices has occurred, and
wherein, at the process of (II), the processor classifies and groups patterns of the power consumption during a preset pattern-acquiring time range before and after the occurrence of the event, to thereby register its result as the fingerprint.

16. The power analyzing device of claim 15, wherein, the processor calculates a standard deviation of the power consumption measured during the preset sampling-time range, and determines a point of time, when at least one of the average power variations departs from the standard deviation, as a time of the occurrence of the event.

17. The power analyzing device of claim 15, wherein the processor registers similar patterns of the power consumption, which have different power factors, as different fingerprints, when classifying and grouping the patterns of the power consumption.

18. The power analyzing device of claim 15, wherein the processor measures the power consumption per multiple of $1/f$ seconds, and wherein f is a frequency of the power fed into the circuit.

19. The power analyzing device of claim 15, wherein the preset pattern-acquiring time range is from one second before the occurrence of the event to ten seconds after the occurrence of the event.

20. The power analyzing device of claim 13, wherein, at the process of (II), the processor determines the number of the individual power devices in the circuit by counting the number of the pairs of the specific motifs.

21. The power analyzing device of claim 13, wherein, at the process of (II), the processor, if power factors of the pairs of the specific motifs, whose differences in the number of occurrences per motif are within the preset range and whose average power variations are symmetrical to each other, are different from each other, determines the pairs of the specific motifs do not correspond to the operation state of the specific power device.

22. The power analyzing device of claim 13, wherein, at the process of (II), the processor acquires one or more power pattern profiles during a preset time range including points of time when the individual power devices are turned ON or OFF by referring to the acquired power pattern information, and if power consumptions per time are compared among the acquired power pattern profiles and if the power pattern profiles are classified into a plurality of groups, wherein the power consumptions per time corresponding to each of the groups are within a preset range, determines each of the groups as having each of its own similar power patterns.

23. The power analyzing device of claim 13, wherein the processor further performs a process of:

(V) calculating individual power consumption within the circuit, based on one or more power pattern profiles during a preset time range including points of time when the individual power devices are turned ON or OFF, by referring to the acquired power pattern information.

24. The power analyzing device of claim 23, wherein, at the process of (V), the processor calculates the individual power consumption of the specific power device by excluding power consumption of devices, other than the specific power device, from the power pattern profiles during the preset time range including the points of time when the individual power devices are turned ON or OFF by referring to the acquired power pattern information.

* * * * *